United States Patent [19]
Reisinger et al.

[11] Patent Number: 6,040,995
[45] Date of Patent: Mar. 21, 2000

[54] METHOD OF OPERATING A STORAGE CELL ARRANGEMENT

[75] Inventors: Hans Reisinger, Grünwald, Germany; Ulrike Grüning, Hopewell Junction, N.Y.; Hermann Wendt, Grasbrunn, Germany; Reinhard Stengl, Stadtbergen, Germany; Volker Lehmann, München, Germany; Josef Willer, Riemerling, Germany; Martin Franosch, München, Germany; Herbert Schäfer, Höhenkirchen-Siegertsbrunn, Germany; Wolfgang Krautschneider, Hohenthann, Germany; Franz Hofmann, München, Germany; Thomas Böhm, Berlin, Germany

[73] Assignee: Siemens Aktiengesellschaft, Munich, Germany

[21] Appl. No.: 09/230,614

[22] PCT Filed: Jul. 29, 1997

[86] PCT No.: PCT/DE97/01601

§ 371 Date: Jan. 28, 1999

§ 102(e) Date: Jan. 28, 1999

[87] PCT Pub. No.: WO98/06140

PCT Pub. Date: Feb. 12, 1998

[30] Foreign Application Priority Data

Aug. 1, 1996 [DE] Germany .................. 196 31 155

[51] Int. Cl.$^7$ ................................................. H01L 27/02
[52] U.S. Cl. ........................ 365/185.18; 365/185.03; 365/189.01; 365/185.01; 365/185.14; 257/324
[58] Field of Search .................. 365/185.01, 189.01, 365/185.14, 185.03; 257/324

[56] References Cited

U.S. PATENT DOCUMENTS

| 4,996,571 | 2/1991 | Kume et al. | 365/218 |
|---|---|---|---|
| 5,436,481 | 7/1995 | Egawa et al. | 257/324 |
| 5,952,692 | 9/1999 | Nakazato et al. | 257/321 |

Primary Examiner—Viet Q. Nguyen
Attorney, Agent, or Firm—Hill & Simpson

[57] ABSTRACT

For the operation of a memory cell arrangement with MOS transistors as memory cells that comprise a dielectric triple layer (5) with a first silicon oxide layer (51), a silicon nitride layer (52) and a second silicon oxide layer (53) as gate dielectric, whereby the silicon oxide layers are respectively at least 3 nm thick, a first cutoff voltage value is allocated to a first logical value and a second cutoff voltage value of the MOS transistor is allocated to a second logical value for storing digital data. The information stored in the memory cell can be modified by applying corresponding voltage levels, although a complete removal of charge stored in the silicon nitride layer is not possible because of the thickness of the silicon oxide layers. What is exploited when modifying the cutoff voltage is that the electrical field in the dielectric triple layer is distorted by charge stored in the silicon nitride layer.

4 Claims, 1 Drawing Sheet

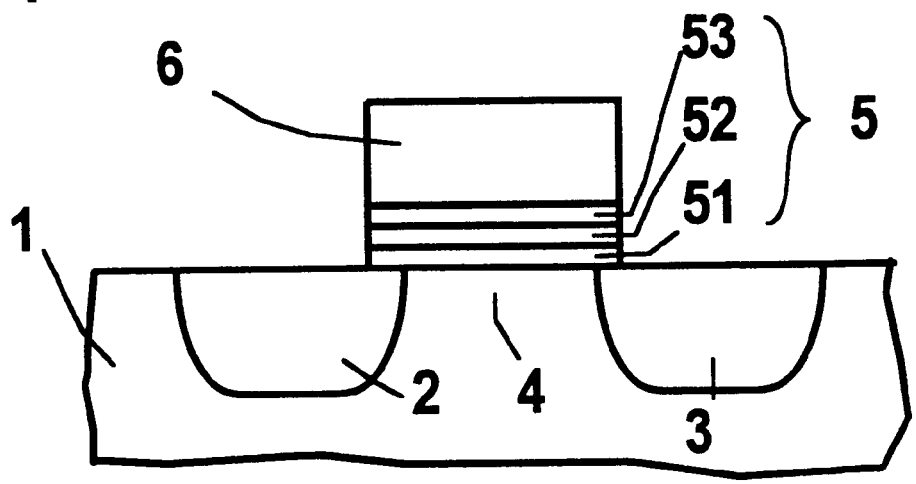

METHOD OF OPERATING A STORAGE CELL ARRANGEMENT

BACKGROUND OF THE INVENTION

Non-volatile EEPROM cells are usually employed for permanent storage of data. Various technologies have been proposed for the realization of EEPROM cells (see, for example, Lai et al., IEDM Tech. Dig. 1986, pp. 580 through 586).

On the one hand, specific MOS transistors are employed as memory cells in what are referred to as SONOS or MNOS cells. The MOS transistor comprises a gate dielectric that comprises at least a silicon nitride layer under the gate electrode and an silicon oxide layer between the silicon nitride layer and the channel region. For storing information, charge carriers are stored in the silicon nitride layer.

The thickness of the silicon oxide layer in SONOS cells amounts to a maximum of 2.2 nm. The thickness of the silicon nitride layer in modern SONOS memories usually amounts to about 10 nm. A further silicon oxide layer that comprises a thickness of 3 to 4 nm is usually provided between the silicon nitride layer and the gate electrode. These non-volatile memory cells can be electrically written and erased. In the write event, such a voltage is applied to the gate electrode that charge carriers from the substrate tunnel into the silicon nitride layer through the maximally 2.2 nm thick silicon oxide layer. For erasing, the gate electrode is wired such that the charge carriers stored in the silicon nitride layer tunnel through the maximally 2.2 nm thick silicon oxide layer into the channel region and charge carriers of the opposite conductivity type tunnel through the silicon oxide layer into the silicon nitride layer.

The SONOS cells exhibit a time of $\leq 10$ years for the data preservation. This time is too short for many applications, for example for the storing of data in computers.

EEPROM cells with floating gate are employed as alternative to the SONOS cells. These are suitable for applications in which longer times are demanded for the data preservation. A floating gate electrode that is completely surrounded by dielectric material is arranged between a control gate electrode and the channel region of the MOS transistor in these memory cells. The information is stored on the floating gate electrode in the form of charge carriers. These memory cells, which are also referred to as FLOTOX cells, can be electrically written and erased. To that end, the control gate electrode is connected to such a potential that charge carriers flow from the channel region onto the floating gate (writing) or, respectively, charge carriers flow from the floating gate into the channel region (erasing). These FLOTOX cells exhibit times of less than 150 years for the data preservation.

Compared to the SONOS cells, however, they are complicated in structure. Further, the space requirement compared to SONOS cells is greater since the control gate electrode must laterally overlap the floating gate electrode. Finally, what is referred to as the radiation hardness of FLOTOX cells is limited. What is meant by radiation hardness is the insensitivity of the stored charge to external radiation sources and/or electromagnetic fields.

SUMMARY OF THE INVENTION

The invention is based on the problem of specifying a method for the operation of a memory cell arrangement, whereby a time of at least 150 years is achieved for the data preservation and whereby digital information stored in the memory cell arrangement can be electrically modified.

The inventive method employs a memory cell arrangement that, as memory cells, respectively comprises an MOS transistor with source zone, channel region, drain zone, gate dielectric and gate electrode that comprises a dielectric triple layer as gate dielectric. The dielectric triple layer comprises a first silicon oxide layer, a silicon nitride layer and a second silicon oxide layer. The silicon nitride layer is arranged between the two silicon oxide layers. The first silicon oxide layer and the second silicon oxide layer respectively comprise a thickness of at least 3 nm.

The memory cell employed in the inventive method differs from conventional SONOS cells in that the first silicon oxide layer, which is arranged between the channel region of the MOS transistor and the silicon nitride layer, comprises a thickness of at least 3 nm. This thickness amounts to a maximum of 2.2 nm in conventional SONOS cells.

The inventive method makes use of the perception that the charge transport through the first silicon oxide layer in conventional SONOS cells ensues mainly by direct tunneling and modified Fowler-Nordheim tunneling. The tunnel probability for direct tunneling and modified Fowler-Nordheim tunneling and, thus, the current intensity for the charge carrier transport by these tunneling mechanisms is mainly dependent on the thickness of the tunnel barrier, that is, the thickness of the first silicon oxide layer, and on the electrical field. Since the first silicon oxide layer in conventional SONOS cells is maximally 2.2 nm thick and the second silicon oxide layer is 3 to 4 nm thick, the current by direct tunneling through the first silicon oxide layer always predominates given electrical fields below 10 MV/cm. Both the writing as well as the erasing of the information—on the basis of corresponding wiring of the gate electrode—ensues via this direct tunnel current.

Even without wiring the gate electrode, a tunnel current that is based on direct tunneling flows through the first silicon oxide layer from the silicon nitride layer to the channel region in conventional SONOS cells. It was found that this direct tunnel current defines the time for the data preservation.

Also exploited in the inventive method is that the tunnel probability for direct tunneling decreases greatly with increasing thickness of the first silicon oxide layer and is extremely small given a thickness of at least 3 nm. Given a thickness of 3 nm, the tunnel probability for direct tunneling lies below that at 2 nm by a factor of more than $10^6$.

Since the first silicon oxide layer and the second silicon oxide layer in the memory cell that is utilized in the inventive method are respectively at least 3 nm thick, a charge carrier transport from the silicon nitride layer to the gate electrode or to the channel region by direct tunneling is largely avoided in this memory cell. That is, charge stored in the silicon nitride layer is preserved practically unlimited. The time for the data preservation in the inventive memory cell is therefore clearly greater than in conventional SONOS cells. It amounts to >1000 years instead of 10 years given convention SONOS cells.

Since the thicknesses of the first silicon oxide layer and of the second silicon oxide layer in the memory cell employed in the inventive method respectively amount to at least 3 nm, the tunnel probability for direct tunneling of charge carriers through the two silicon oxide layers is very low. A charge carrier transport occurs only by Fowler-Nordheim tunneling through the first silicon oxide layer or, respectively, second silicon oxide layer. The current intensity of the charge carrier transport by Fowler-Nordheim tunneling is only dependent on the strength of the adjacent electrical field. It is not explicitly dependent on the thickness of the tunnel barrier, that is, the thickness of the first silicon oxide layer or, respectively, second silicon oxide layer.

The Fowler-Nordheim tunneling of electrons dominates the charge carrier transport in the employed memory cell regardless of the polarity of the adjacent field. That is, Fowler-Nordheim tunneling of electrons into the silicon nitride layer occurs both when a positive voltage as well as when a negative voltage is applied to the gate electrode. When a positive voltage is adjacent at the gate electrode, then electrons tunnel from the channel region through the first silicon oxide layer into the silicon nitride layer. When, by contrast, a negative voltage is adjacent at the gate electrode, then electrons tunnel by Fowler-Nordheim tunneling from the gate electrode through the second silicon oxide layer into the silicon nitride layer.

Since electrons are transported into the silicon nitride layer by Fowler-Nordheim tunneling in this memory cell regardless of the polarity adjacent at the gate electrode, once electrons have been transported into the silicon nitride layer they can no longer be completely removed.

What is exploited in the inventive method is that the current intensity of the charge carrier transport by Fowler-Nordheim tunneling is dependent on the intensity of the adjacent electrical field. A first write voltage is applied to the gate electrode of the memory cell for writing a first logical value into the memory cell; a second write voltage is applied to the gate electrode of the memory cell for writing a second logical value.

What is exploited for modifying the information stored in the memory cell is that, when a negative voltage is adjacent at the gate electrode, the current intensity of the charge carrier transport through the first silicon oxide layer is greater than the current intensity through the second silicon oxide layer because the charge amount stored in the silicon nitride layer distorts the electrical field. The charge amount stored in the silicon nitride layer effects that the electrical field that is effective over the first silicon oxide layer between channel region and silicon nitride layer is greater than the electrical field that is effective over the second silicon oxide layer between the gate electrode and the silicon nitride layer.

For modifying the information stored in the memory cell, for example, a positive voltage is applied to the gate electrode when the logical value to which the lesser of the two charge quantities in the gate dielectric is allocated was stored. When the logical value to which the greater of the two charge amounts is allocated was stored, a negative voltage is applied to the gate electrode.

Alternatively, the gate electrodes of a plurality of memory cells are simultaneously charged with a negative voltage. As a result thereof, a reduction of the charge amount in the gate dielectric occurs in the gate electrodes of the appertaining memory cells. In this way, all memory cells are charged with the lower charge amount block-by-block. Subsequently, the memory cells in which the other logical value is to be stored are written in the above-described way. What is exploited in this method is that the charge amounts stored in the gate dielectric hardly change when the appertaining write voltage is applied again. This method has the advantage that a modification of the stored information is possible faster since the modification of the charge amount to the lesser value, which is time-consuming, respectively ensues simultaneously by blocks for a plurality of memory cells.

The difference of the thicknesses of the first silicon oxide layer and the second silicon oxide layer preferably lies in the range between 0.5 and 1 nm. The lesser of the thicknesses of the first silicon oxide layer and the second silicon oxide layer lies in the range between 3 and 5 nm. The thickness of the silicon nitride layer amounts to at least 5 nm. The MOS transistor respectively comprises a gate electrode of n-doped silicon. In this case, it is advantageous to set the higher value of the first cutoff voltage value and of the second cutoff voltage value to 4 through 6 V, preferably 4 V. The lower value of the first cutoff voltage value and of the second cutoff voltage value is set lower by 0.5 through 1.5 V, preferably by 1 V. For reading the information out, a read voltage is applied that lies between the first cutoff voltage value and the second cutoff voltage value and that preferably lies just above, for example 0.1 through 0.5 V above, the lower cutoff voltage value.

The first charge amount and the second charge amount are preferably dimensioned such that they both effect a positive shift of the cutoff voltage. Switching back and forth between the first cutoff voltage value and the second cutoff voltage value can be fast, these voltage values being stable because of the layer thicknesses.

The gate electrode can be formed both of n-doped silicon as well as metal, metal silicide or $p^+$-doped silicon. The employment of $p^+$-doped silicon for the gate electrode has the advantage that the energy stored in the memory cell arrangement can be modified faster.

Memory cell arrangements that, as generally standard, comprise a plurality of identical memory cells matrix-like can be operated with the inventive method.

The MOS transistors in the memory cells can be fashioned both as planar as well as as vertical MOS transistors.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The Figure shows a memory cell with a planar MOS transistor.

DESCRIPTION OF THE PREFERRED EMBODIMENTS

A source zone 2 and a drain zone 3 that, for example, are n-doped are provided in a substrate 1 that comprises monocrystalline silicon at least in the region of a memory cell. A channel region 4 is arranged between the source zone 2 and the drain zone 3. Source zone 2, channel region 4 and drain zone 3 are, for example, arranged next to one another at the surface of the substrate 1. Alternatively, they can also be arranged as a vertical layer sequence.

A dielectric triple layer 5 that comprises a first $SiO_2$ layer 51, a $Si_3N_4$ layer 52 and a second $SiO_2$ layer 53 is arranged above the channel region 4. The first $SiO_2$ layer 51 is arranged at the surface of the channel region 4 and comprises a thickness of 3 through 5 nm, preferably 4 nm. The $Si_3N_4$ layer 52 is arranged at the surface of the first $SiO_2$ layer 51. It comprises a thickness of at least 5 nm, preferably 8 nm. The second $SiO_2$ layer 53 is arranged at the surface of the $Si_3N_4$ layer 52, its thickness being 0.5 through 1 nm greater than the thickness of the first $SiO_2$ layer 51, that is, lying in the range between 3.5 and 6 nm, preferably at 4.5 through 5 nm.

A gate electrode 6 of, for example, n-doped polysilicon is arranged on the surface of the dielectric triple layer 5. The gate electrode 6 comprises a thickness of, for example, 200 nm and a dopant concentration of, for example, $10^{21}$ cm$^{-3}$. Alternatively, the gate electrode can also be formed of metal, for example aluminum, a metal silicide, for example TiSi$_2$, or of p$^+$-doped polysilicon.

For operating a memory cell arrangement with a plurality of identical memory cells, as shown in the Figure, a positive voltage is applied to the gate electrode of the memory cell for the initial write-in of an information into one of the memory cells. A first write voltage of +14 V is applied to the gate electrode for writing in a first logical value, to which a 3 V cutoff voltage of the MOS transistor is allocated. The write time amounts to 1 ms. For writing in a second logical value, to which a second cutoff voltage of 4 V is allocated, a second write voltage of 15.5 V is applied to the gate electrode. The write time amounts to 1 ms.

For readout of the information, a read voltage of 3.1 V is applied to the gate electrode. When the first logical value that is allocated to a cutoff voltage of 3 V is stored in the memory cell, then the MOS transistor is not conductive. When, by contrast, the second logical value that is allocated to a cutoff voltage of 4 V is stored, then a current flows through the MOS transistor.

In order to modify the information stored in the memory cell, a voltage of +15.5 V is applied to the gate electrode of the memory cell for 1 ms when the second logical value was stored in the memory cell. As a result thereof, the cutoff voltage of the MOS transistor changes from the previous 3 V to 4 V, so that the second logical value is now stored in the memory cell.

When, by contrast, the memory cell exhibits a cutoff voltage of 4 V since the second logical value is stored in the memory cell, a voltage of −14 V is applied to the gate electrode for 300 ms for modifying the stored information. Since the current intensity due to Fowler-Nordheim tunneling from the silicon nitride layer into the channel region is higher at this voltage than from the gate electrode into the silicon nitride layer, the cutoff voltage of the MOS transistor changes as a result thereof from 4 V to 3 V, so that the first logical value is stored in the memory cell after the write event. This asymmetry of the current intensities is caused by the charge amount stored in the silicon nitride layer, which leads to a distortion of the electrical field.

The time for the data preservation in the memory cell amounts to more than 1000 years. It was found by extrapolation that, even after 1000 years, the difference between the first cutoff voltage value and the second cutoff voltage value is greater than 0.8 V given a first cutoff voltage value of 3 V and a second cutoff voltage value of 4 V. This difference is referred to as memory window. That is, even after 1000 years, a distinction between the first logical value and the second logical value can doubtlessly be made by applying a read voltage of 3.1 V.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for operating a memory cell arrangement, comprising the steps of:

using MOS transistors each having a dielectric triple layer with a first silicon oxide layer, a silicon nitride layer and a second silicon oxide layer as gate dielectric, as memory cells, the first silicon oxide layer and the second silicon oxide layer being respectively at least 3 nm thick;

applying, for writing a first logical value into one of the memory cells, a first charge amount onto the gate dielectric by Fowler-Nordheim tunneling, said first charge amount being stored in the gate dielectric thereby effecting a first cutoff voltage value of the MOS transistor;

applying for writing a second logical value into one of the memory cells, a second charge amount onto the gate dielectric by Fowler-Nordheim tunneling, said second charge amount being stored in the gate dielectric thereby effecting a second cutoff voltage value of the MOS transistor;

applying, for readout of digital information from one of the memory cells, a read voltage to the gate electrode of the memory cell, said read voltage lying between the first cutoff voltage value and the second cutoff voltage value, the read voltage being evaluated as to whether a current flows through the MOS transistor or not.

2. The method according to claim 1, wherein a difference of thicknesses of the first silicon oxide layer and the second silicon oxide layer lies in the range between 0.5 nm and 1 nm;

wherein a lesser of thicknesses of the first silicon oxide layer and the second silicon oxide layer lies in the range between 3 and 5 nm;

wherein thickness of the silicon nitride layer amounts to at least 5 nm;

wherein the MOS respectively has a gate electrode of n-doped silicon.

3. The method according to claim 1, wherein a greater of the first cutoff voltage value and the second cutoff voltage value lies between 4 and 6 V; and wherein a spacing between the first cutoff voltage value and the second cutoff voltage value lies between 0.5 and 1.5 V.

4. The method according to claim 1, wherein the first charge amount and the second charge amount are respectively dimensioned such that the first and second charge amounts effect a positive shift of the cutoff voltage.

* * * * *